United States Patent
Park et al.

(10) Patent No.: US 7,533,310 B2
(45) Date of Patent: May 12, 2009

(54) SEMICONDUCTOR MEMORY TEST DEVICE AND METHOD THEREOF

(75) Inventors: Je-Young Park, Yongin-si (KR); Ki-Sang Kang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 316 days.

(21) Appl. No.: 11/640,893

(22) Filed: Dec. 19, 2006

(65) Prior Publication Data
US 2007/0162794 A1 Jul. 12, 2007

(30) Foreign Application Priority Data
Dec. 19, 2005 (KR) .................. 10-2005-0125387

(51) Int. Cl.
*G11C 29/00* (2006.01)
(52) U.S. Cl. ............................ 714/723; 714/2; 714/3; 714/5; 714/6; 714/7; 714/8; 714/42; 714/710; 714/711; 714/718; 714/719; 714/724; 714/742; 714/743; 365/201; 711/165
(58) Field of Classification Search .................. None
See application file for complete search history.

(56) References Cited

U.S. PATENT DOCUMENTS

| | | | | |
|---|---|---|---|---|
| 6,094,738 A | * | 7/2000 | Yamada et al. ............... | 714/738 |
| 6,360,341 B1 | * | 3/2002 | Yoshinaga .................... | 714/718 |
| 6,363,500 B1 | * | 3/2002 | Hamada ........................ | 714/25 |
| 6,523,143 B1 | * | 2/2003 | Kobayashi .................... | 714/718 |
| 6,826,111 B2 | | 11/2004 | Schneider et al. | |
| 2004/0153274 A1 | * | 8/2004 | Fukuda ......................... | 702/117 |
| 2006/0067135 A1 | * | 3/2006 | Motomochi et al. ..... | 365/189.04 |

FOREIGN PATENT DOCUMENTS

| JP | 2003-084044 | 3/2003 |
|---|---|---|
| JP | 2003-187595 | 7/2003 |
| KR | 1020000066527 A | 11/2000 |
| KR | 1020030082847 A | 10/2003 |

\* cited by examiner

*Primary Examiner*—John P Trimmings
(74) *Attorney, Agent, or Firm*—Harness, Dickey & Pierce, P.L.C.

(57) ABSTRACT

A semiconductor memory test device and method thereof are provided. The example semiconductor memory test device may include a fail memory configured to store at least one test result of a memory under test, a mode selecting unit configured to output a selection signal for selecting a memory address protocol of the fail memory based upon which one of a plurality of test modes is active in the memory under test and an address arranging unit configured to arrange address signals to conform with the selected memory address protocol in response to the selection signal received from the mode selecting unit.

14 Claims, 6 Drawing Sheets

FIG.3A

| AREA 0 | AREA 4 |
|---|---|
| AREA 1 | AREA 5 |
| AREA 2 | AREA 6 |
| AREA 3 | AREA 7 |

FIG.3B

| #000 ~ #7FF | #000 ~ #7FF | |
|---|---|---|
| I/0 1 | I/0 0 | #000<br>#0FF |
| I/0 1 | I/0 0 | #100<br>#1FF |
| I/0 1 | I/0 0 | #200<br>#2FF |
| I/0 1 | I/0 0 | #300<br>#3FF |

FIG.3C

| #000 ~ #7FF | #000 ~ #7FF | |
|---|---|---|
| I/O 2 | I/O 3 | #000<br>#0FF |
| I/O 1 | I/O 0 | #000<br>#1FF |
| I/O 2 | I/O 3 | #100<br>#1FF |
| I/O 1 | I/O 0 | #100<br>#1FF |

FIG.3D

| #000 ~ #7FF | #000 ~ #7FF | |
|---|---|---|
| I/O 4 | I/O 2 | #000<br>#0FF |
| I/O 7 | I/O 1 | #000<br>#1FF |
| I/O 0 | I/O 6 | #100<br>#0FF |
| I/O 3 | I/O 5 | #000<br>#0FF |

FIG. 4

| FAIL ADDRESS MEMORY I/O | X8 TEST MODE | X4 TEST MODE | X2 TEST MODE |
|---|---|---|---|
| I/O FOR AREA 0 | I/O 4 | I/O 2 , /Y8 | I/O 1 , /Y8 , /Y9 |
| I/O FOR AREA 1 | I/O 7 | I/O 1 , /Y8 | I/O 1 , Y8 , /Y9 |
| I/O FOR AREA 2 | I/O 0 | I/O 2 , Y8 | I/O 1 , /Y8 , Y9 |
| I/O FOR AREA 3 | I/O 3 | I/O 1 , Y8 | I/O 1 , Y8 , Y9 |
| I/O FOR AREA 4 | I/O 2 | I/O 3 , /Y8 | I/O 0 , /Y8 , /Y9 |
| I/O FOR AREA 5 | I/O 1 | I/O 0 , /Y8 | I/O 0 , Y8 , /Y9 |
| I/O FOR AREA 6 | I/O 6 | I/O 3 , Y8 | I/O 0 , /Y8 , Y9 |
| I/O FOR AREA 1 | I/O 5 | I/O 0 , Y8 | I/O 0 , Y8 , Y9 |

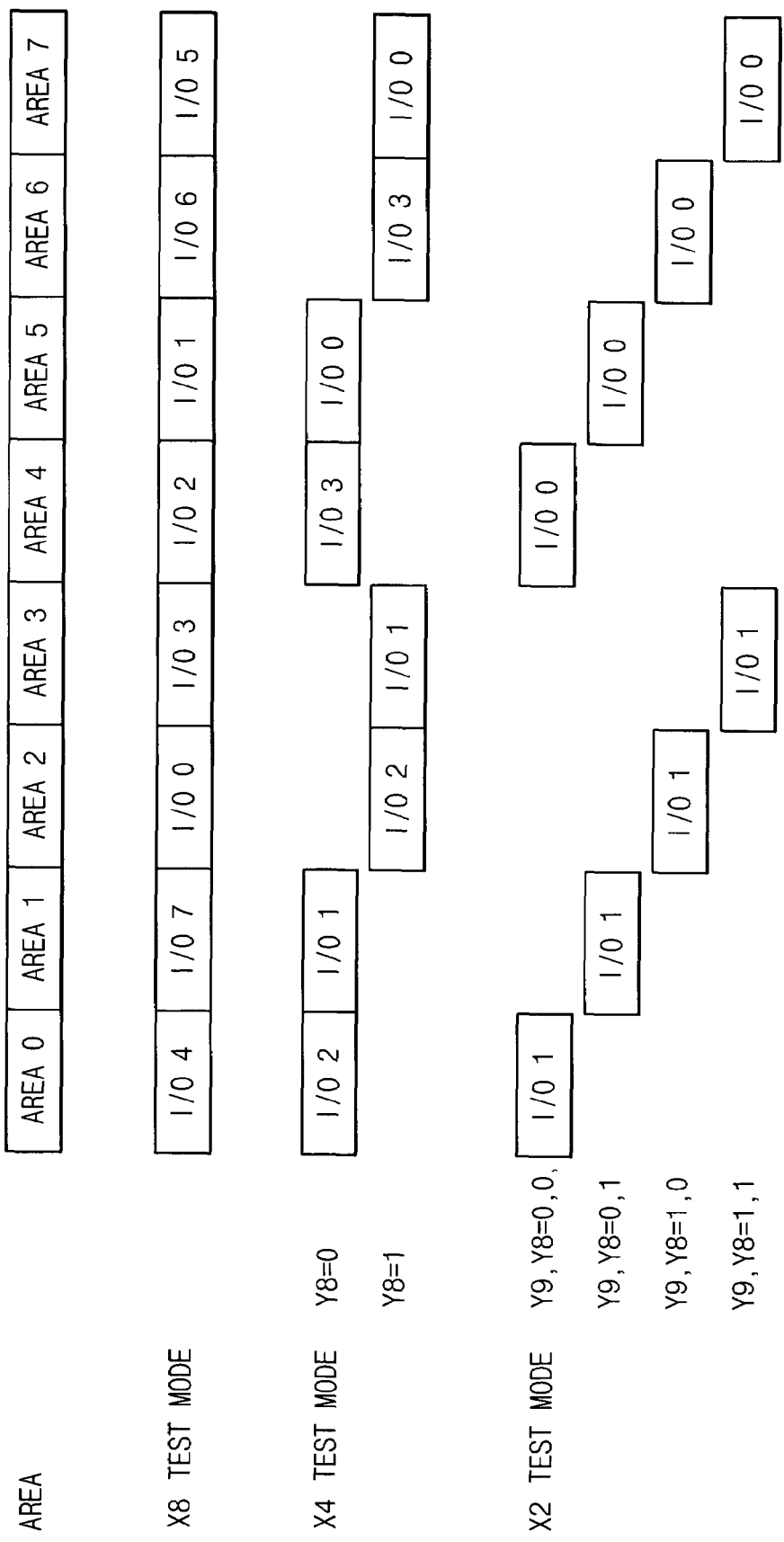

SEMICONDUCTOR MEMORY TEST DEVICE AND METHOD THEREOF

PRIORITY STATEMENT

This application claims priority under 35 USC § 119 to Korean Patent Application No. 2005-125387, filed on Dec. 19, 2005, in the Korean Intellectual Property Office, the disclosure of which is incorporated herein in its entirety by reference.

BACKGROUND OF THE INVENTION

1. Field of the Invention

Example embodiments of the present invention relate generally to a semiconductor memory test device and method thereof, and more particularly to a semiconductor memory test device and method of testing a semiconductor memory device with the semiconductor memory test device.

2. Description of the Related Art

A memory test may typically include a wafer test executed in a wafer stage before a fabrication process and a package test executed in a package stage after the fabrication process. The wafer test may include a pre-laser test executed before a laser repair process and an electronic die sorting (EDS) test executed after the laser repair process. A die passing the EDS test may be manufactured into a package memory through the fabrication process.

The wafer test may be performed in the wafer state. The wafer test may be performed so as to detect failed dyes for which additional processes are performed before manufacturing the dyes into packages. Further, the wafer test may increase a yield of manufactured devices because at least a portion of the failed dyes may be repaired after failure detection.

Conventional memory devices may include redundant cells. If the memory device has one or more failed cells, the memory device may replace the failed cells with the redundant cells (hereinafter referred to as a "repair operation"). The repair operation may be based upon determining which memory cell within the memory device is a failed cell. The pre-laser test may be performed before the laser repair (e.g., the repair operation), and as such, the pre-laser may locate positions of the failed cell(s).

The pre-laser test may generate a bit-map. The bit-map may include a logical bit-map indicating locations of failed cells to logical addresses and a physical bit-map indication locations of failed cells to where the cells may physically positioned on the memory device. Here, the physical bit-map may typically be used in the wafer test.

In the physical bit-map, the logical addresses may be adjusted based on a mode of operation of the memory device (e.g., a test mode). External addresses may differ from the physical addresses corresponding to the actual cell arrangement of the memory device. Such a difference may result from a difference between the physical and logical addresses of the memory cells. The physical addresses may be changed based upon an input/output (I/O) size of the memory device. For example, if the I/O size corresponds to '1,' the logical addresses may be the same as the physical addresses. If the I/O size corresponds to '2,' the logical addresses may require an extra bit for discriminating between the different addresses, and so on.

Generally, conventional semiconductor memory devices may have configurations such as x2, x4, x8, x16 or x32 (e.g., I/O ratios of logical to physical addresses) of output bits in one cycle based on usage. For example, in a dynamic random access memory (DRAM) with 16 megabytes (MBs) of storage, a configuration of the DRAM may be 16 MB×1, 4 MB×4, 2 MB×8 or 1 MB×16. Here, the 16 MB×1 configuration may indicate a memory including 16 MB of 1-bit data, and the 4 MB×4 configuration may indicate a memory, including 4 MB of 4-bit data, the 2 Mb×8 configuration may indicate a memory including 2 MB of 8-bit data and the 1 MB×16 may indicate a memory including 1 MB of 16-bit data. 16 MB memory cells may be integrated on a single chip in each of the above-described configurations.

With respect to an address usage, the configurations may be partitioned based upon column address usage. With regard to a structure of the memory device, bonding pads may be used distinguish the respective configurations (e.g., x16, x8, x4, etc.) and the memory device may be packaged.

In a conventional package structure, in an example, if the memory device is packaged comply with the x16 configuration, the memory may not thereafter be adjusted to another configuration (e.g., into the x8 configuration). Because conventional semiconductor memory device may be adapted to conform with different configurations based upon different manufacturing requirements, tests may be performed based upon which configuration is established for the semiconductor memory device. As discussed above, a memory configuration (e.g., x2, x4, x8, etc.) for a conventional semiconductor memory device may typically be determined once the semiconductor memory device has been packaged (e.g., in a package level). Accordingly, a mode test may be executed at the package level of a fabrication of a conventional semiconductor memory device.

At the package level, tests may be performed on wafer products and multi-chip package products. In addition, while performing the wafer test, articles used in the package test may be processed along with articles used in the wafer test (hereinafter referred to as a "mixed test"). The pre-laser test in the mixed test may experience a number of problems, such as a position of the test article in a program, a method of handling failed bit information, a complex operation of the repair operation, etc.

FIG. 1 is a schematic diagram illustrating a conventional semiconductor memory test device. Referring to FIG. 1, a device under test (DUT) (not shown) may be connected to a tester in the conventional semiconductor memory test device. In the tester, a data selector 1 may receive fail information FAIL of data bits from a logic comparator (not shown). The logic comparator may compare data from the DUT with expected data generated by an algorithmic pattern generator (ALPG).

Referring to FIG. 1, the tester may include the data selector 1, a data formatter 2, an address selector 3, an address formatter 4 and a decoder 5. The data selector 1 may receive pass/fail information FAIL from the logic comparator to output handled data. The data formatter 2 may reorder the handled data from the data selector 1 to a given order by an ordering process based on given values. The address selector 3 may handle addresses ADDRESS from an address generator (not shown) to output handled addresses. The address formatter 4 may reorder the handled addresses from the address selector 3 to a given order by an ordering process based on given values. The decoder 5 may adjust a configuration (e.g., x2, . . . , x16) of a memory under test based upon usage (e.g., column usage).

Referring to FIG. 1, the ordering process of the address formatter 4 and/or the data formatter 2 may be based upon an order of pins during data input/output. The ordering process may include a sequential addressing process and an interleaved addressing process, each of which may be defined within well-known joint electronic device engineering council (JEDEC) protocols.

Referring to FIG. 1, in an example, data may be ordered as [0,1,2,3], [2,3,0,1], [1,2,3,0], [2,3,1,0], [3,0,1,2], etc., by the sequential addressing process. If a standard of a fail memory 10 is fixed, the fail memory 10 may have an unchangeable structure.

The structure may be "unchangeable" or fixed because signals of the decoder 5 may have a fixed format such that fail information may be addressed in the same manner. Therefore, a fail address may be incorrectly assigned due to a mismatching between areas of the memory under test and the fail memory if a test mode or memory configuration is changed. Thus, for example, if the memory under test changes from a x2 memory address protocol to an x8 memory address protocol for logical to physical address mapping. In addition, if the test mode or memory address protocol is changed, a program to adjust the standard of the memory configuration of the fail memory may be relatively complex and expensive.

SUMMARY OF THE INVENTION

An example embodiment of the present invention is directed to a semiconductor memory test device, including a fail memory configured to store at least one test result of a memory under test, a mode selecting unit configured to output a selection signal for selecting a memory address protocol of the fail memory based upon which one of a plurality of test modes is active in the memory under test and an address arranging unit configured to arrange address signals to conform with the selected memory address protocol in response to the selection signal received from the mode selecting unit.

Another example embodiment of the present invention is directed to a method of testing a semiconductor memory test device, including selecting a memory address protocol of a fail memory based upon which one of a plurality of test modes is active in a memory under test, outputting a selection signal indicating the selected memory address protocol and arranging address signals to conform with the selected memory address protocol in response to the selection signal.

Another example embodiment of the present invention is directed to a semiconductor memory test device capable of adjusting mapped logical addresses according based upon a test mode of a memory under test.

Another example embodiment of the present invention is directed to a method of testing a semiconductor memory device capable of adjusting mapped logical addresses according to a test mode of a memory under test.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

FIG. 3A illustrates a physical division of areas of a memory according to another example embodiment of the present invention.

FIG. 3B illustrates a structure of logical addresses of the fail memory in a x2 mode according to another example embodiment of the present invention.

FIG. 3C illustrates a structure of logical addresses of the fail memory in a x4 mode according to another example embodiment of the present invention.

FIG. 3D illustrates a structure of logical addresses of the fail memory in a x8 mode according to another example embodiment of the present invention.

FIG. 4 is a table illustrating area assignments of the fail memory in x2, x4 and x8 test according to another example embodiment of the present invention.

FIG. 5 is a diagram illustrating a one-to-one mapping of the physical addresses of the fail memory into the logical addresses according to another example embodiment of the present invention.

DETAILED DESCRIPTION OF EXAMPLE EMBODIMENTS OF THE PRESENT INVENTION

Figure 1:
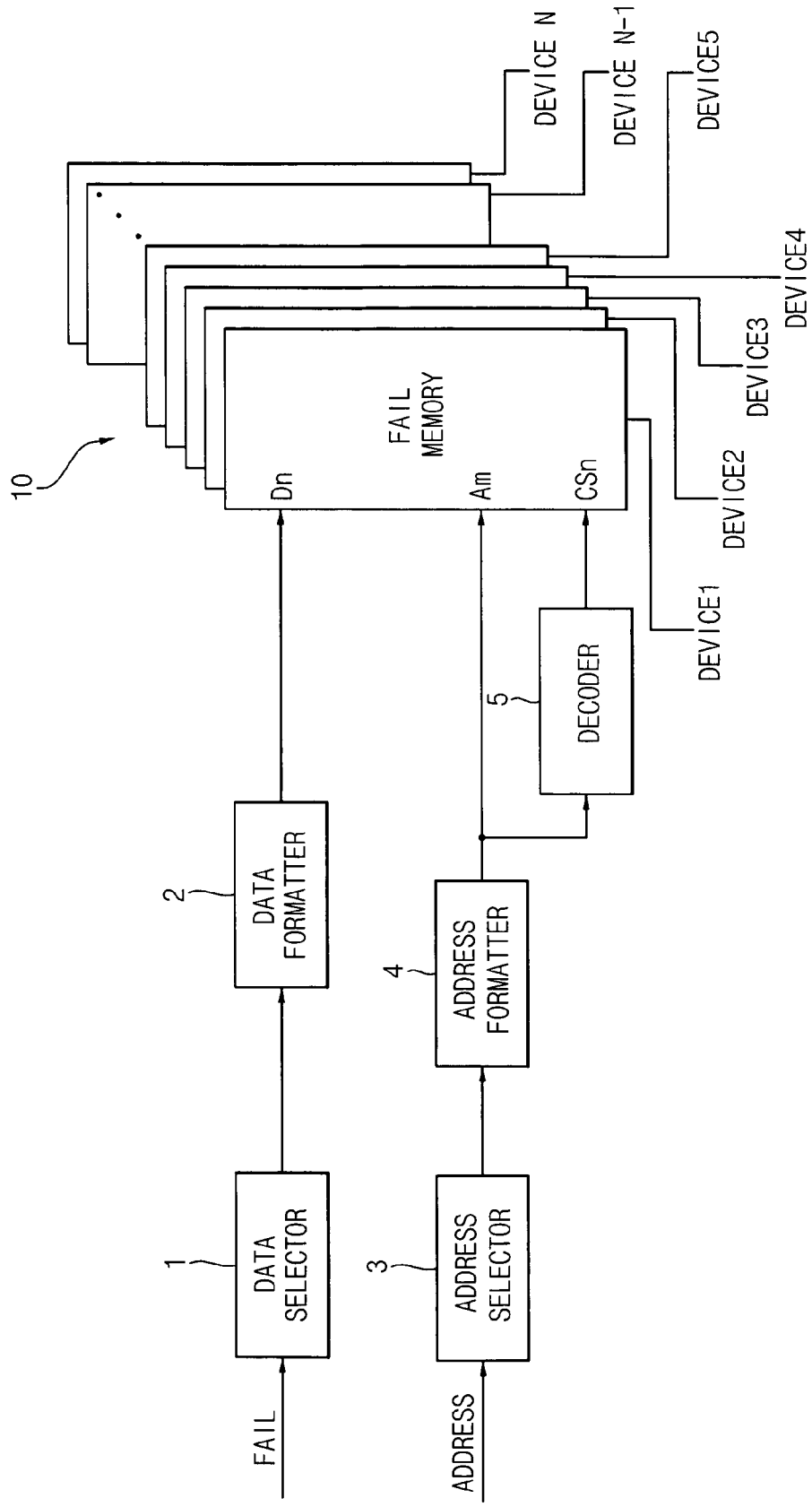
FIG. 1 is a schematic diagram illustrating a conventional semiconductor memory test device.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention are susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention are to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
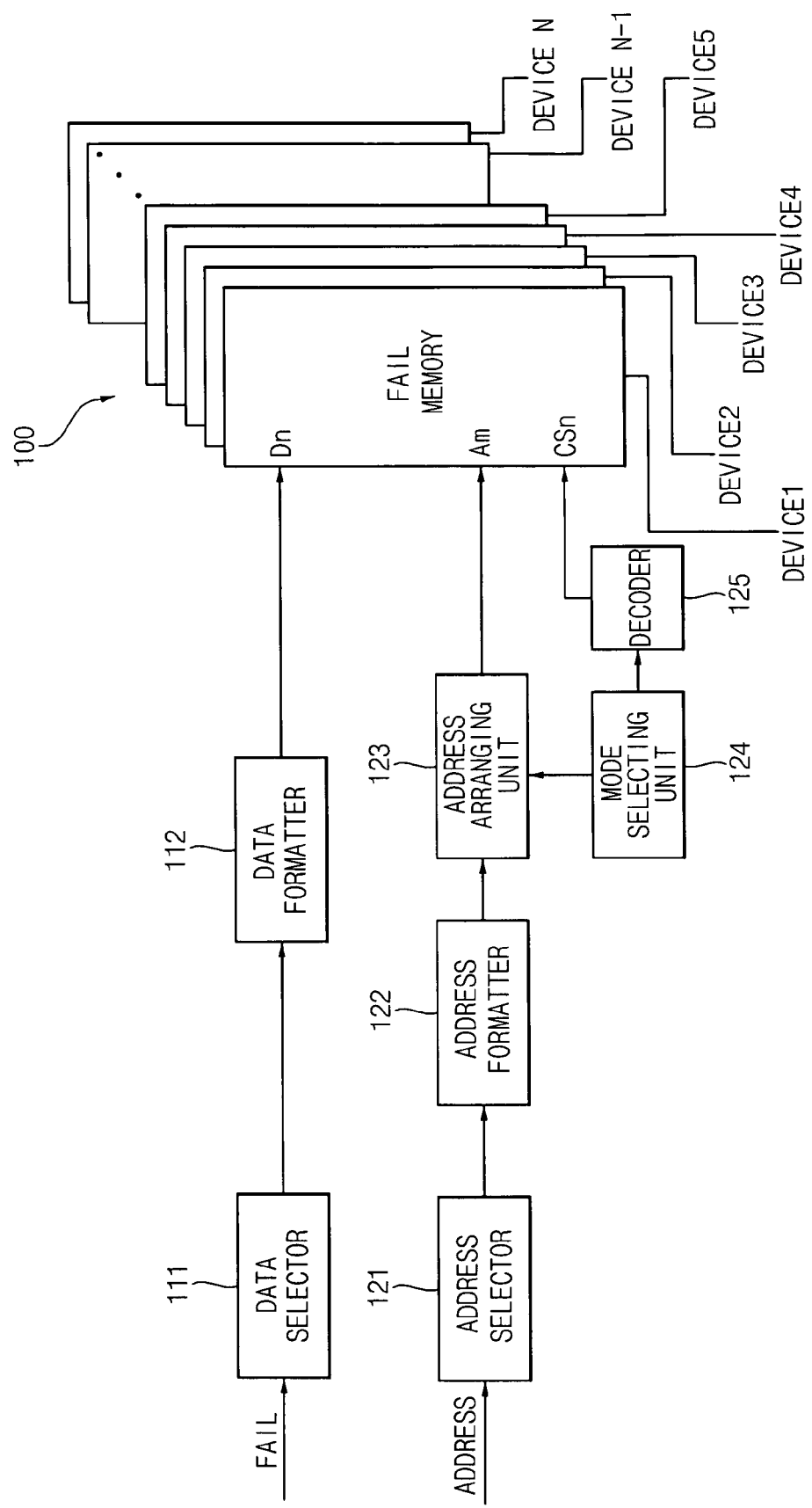
FIG. 2 is schematic diagram illustrating a semiconductor memory test device according to an example embodiment of the present invention.

FIG. 2 is schematic diagram illustrating a semiconductor memory test device according to an example embodiment of the present invention. The example embodiment of FIG. 2 includes certain elements in common with conventional FIG. 1. Accordingly, a duplicate description of such elements has been omitted for the sake of brevity.

In the example embodiment of FIG. 2, the semiconductor memory test device may include a mode selecting unit 124, an address arranging unit 123 and a decoder 125. The mode selecting unit 124 may select a standard (e.g., a memory address protocol, such as x2, x4, x8, etc.) of a fail memory 100 based upon an expected usage. The address arranging unit 123 may adjust or arrange addresses from an address formatter 122 based upon the memory address protocol indicated by the selection signal of the mode selecting unit 124. The decoder 125 may output a signal indicating the selected standard of the fail memory 100 in response to the selection signal of the mode selecting unit 124.

In the example embodiment of FIG. 2, the mode selecting unit 124 may select a mode based upon an expected usage of a device under test (DUT) to provide mode information to the fail memory 100. The mode selecting unit 124 may select the mode based upon mode register set (MRS) commands.

In the example embodiment of FIG. 2, the address arranging unit 123 may arrange or map the addresses into logical addresses in response to the selection signal of the mode selecting unit 124 to provide the logical addresses to the fail memory 100.

Example of address arrangements of the fail memory 10 will now be described with reference to the example embodiments of FIGS. 3A, 3B, 3C and 3D.

FIG. 3A illustrates a physical division of areas of a memory according to another example embodiment of the present invention. In the example embodiment of FIG. 3A, the areas of the memory may be divided into eight areas, labeled as AREA 0 to AREA 7.

FIG. 3B illustrates a structure of logical addresses of the fail memory in a x2 mode according to another example embodiment of the present invention.

FIG. 3C illustrates a structure of logical addresses of the fail memory in a x4 mode according to another example embodiment of the present invention.

FIG. 3D illustrates a structure of logical addresses of the fail memory in a x8 mode according to another example embodiment of the present invention.

FIG. 4 is a table illustrating area assignments (e.g., based upon physical areas AREA0 through AREA7 of FIG. 3A) of the fail memory in x2, x4 and x8 test modes (e.g., in accordance with FIGS. 3B, 3C and 3D, respectively) according to another example embodiment of the present invention.

In the example embodiment of FIG. 4, in the x8 test mode, each area may be assigned to corresponding logical addresses by input/output numbers. In the x4 test mode, each area may be assigned by corresponding logical addresses and an extra bit (e.g., Y8) to discriminate between two different areas having the same input/output number. In the x2 test mode, each area may be assigned by corresponding logical addresses and two bits (e.g., Y8 and Y9) to discriminate between four different areas having the same input/output number, and so on.

As described above, address assignments to each area may be different based upon which test mode (e.g., x2, x4, x8, x16, etc.) is active (e.g., within the DUT or memory device).

FIG. 5 is a diagram illustrating a one-to-one mapping of the physical addresses of the fail memory into the logical addresses according to another example embodiment of the present invention.

In the example embodiment of FIG. 5, in the x8 test mode, each of the areas AREA 0 to AREA 8 may be mapped to, for example, I/O 4, I/O 7, I/O 0, I/O 3, I/O 2, I/O 1, I/O 6 and I/O 5, respectively. In the x4 test mode, each of the areas may be mapped to, for example, I/O 2 and /Y8, I/O 1 and /Y8, I/O 2 and Y8, I/O 1 and Y8, I/O 3 and /Y8, I/O 0 and /Y8, I/O 3 and Y8, and I/O 0 and Y8, respectively. In the x2 test mode, each of the areas may be mapped to, for example, I/O 1, /Y8 and /Y9, I/O 1, /Y9 and Y8, I/O 1, Y9 and /Y8, I/O 1, Y9 and Y8, I/O 0, /Y8 and /Y9, I/O 0, /Y9 and Y8, I/O 0, Y9 and /Y8, and I/O 0, Y9 and Y8, respectively. However, it should be understood that the example mappings illustrated in FIG. 5 are intended to show example variations of area mappings in different test modes, and many other variations of address assignments may be present in other example embodiments of the present invention.

In the example embodiment of FIG. 5, after the logical addresses are mapped to the physical addresses as described above, the actual test of the semiconductor memory device may be performed, as will now be described in greater detail.

In an example test of the semiconductor memory device of FIG. 2, with reference to FIGS. 3A through 5, a test mode of the fail memory may be set to a given test mode (e.g., x1, x2, x4, x8 and x16), for example, based upon usage of the DUT. The test to detect memory failure(s) may begin after the test mode of the fail memory is set. During the test, a fail state may be written to the logical address of the fail memory corresponding to an address of a failed cell of the DUT If a failed cell is not detected, the entire address may pass (e.g., not be recorded as a failure). Alternatively, if the failed cell is detected, each individual memory cell may be tested so as to write a particular position of the failed cell or cells to the logical address of the fail memory.

In the example test of the semiconductor memory device of FIG. 2, with reference to FIGS. 3A through 5, writing the fail state to the logical address of the fail memory corresponding to the address of the failed cell of the DUT may be repeated as long as memory failure(s) are detected until a pass/fail test of the last memory cell in the DUT is completed.

In another example embodiment of the present invention, a semiconductor memory test device may locate an actual position where a memory failure occurs by mapping logical addresses to physical addresses based upon a mode (e.g., memory addressing configuration, such as x2, x4, x8, x16, etc.) of a memory under test, instead of setting a logical addressing scheme for memory failure detection based upon only a default test mode (e.g., default meaning fixed during and after a packaging of the memory).

Example embodiments of the present invention being thus described, it will be obvious that the same may be varied in many ways. For example, the particular memory address protocols (e.g., x2, x4, x8, x16, etc.) described above are given for example purposes only, and it is understood that the memory under test as well as the fail memory may be configured to operate in accordance with any well-known memory addressing protocol in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A semiconductor memory test device, comprising:
   a fail memory configured to store at least one test result of a memory under test;
   a mode selecting unit configured to output a selection signal for selecting a memory address protocol of the fail memory based upon which one of a plurality of test modes is active in the memory under test; and
   an address arranging unit configured to arrange address signals to conform with the selected memory address protocol in response to the selection signal received from the mode selecting unit.

2. The semiconductor memory test device of claim 1, wherein the mode selecting unit is configured to select a mode in response to mode register set (MRS) commands.

3. The semiconductor memory test device of claim 1, wherein the address arranging unit is configured to map physical address signals with logical address signals.

4. The semiconductor memory test device of claim 1, wherein each test result indicates whether a given memory cell of the memory under test is operating normally.

5. The semiconductor memory test device of claim 1, wherein the memory under test includes a plurality of physical areas.

6. The semiconductor memory test device of claim 5, wherein each of the plurality of physical areas is assigned a unique number, and the memory addressing protocol distinguishes between the plurality of physical areas at least based upon the assigned numbers.

7. The semiconductor memory test device of claim 5, wherein the memory under test includes eight physical areas.

8. The semiconductor memory test device of claim 7, wherein, if the memory under test is operating in a x8 test mode, the memory addressing protocol distinguishes between the plurality of physical areas based upon a unique number assigned to the physical area.

9. The semiconductor memory test device of claim 7, wherein, if the memory under test is operating in a x4 test mode, the memory addressing protocol distinguishes between the plurality of physical areas based upon a unique number assigned to the physical area and at least one additional bit.

10. The semiconductor memory test device of claim 7, wherein, if the memory under test is operating in a x2 test mode, the memory addressing protocol distinguishes between the plurality of physical areas based upon a unique number assigned to the physical area and at least two additional bits.

11. A method of testing a semiconductor memory device, comprising:
    selecting a memory address protocol of a fail memory based upon which one of a plurality of test modes is active in a memory under test;
    outputting a selection signal indicating the selected memory address protocol; and
    arranging address signals to conform with the selected memory address protocol in response to the selection signal.

12. The method of claim 11, wherein the selected memory address protocol is one of x1, x2, x4, x8 and x16.

13. The method of claim 11, wherein the selected memory address protocol is based upon usage of the memory under test.

14. The method of claim 11, further comprising:
    testing each memory cell within the memory under test; and
    storing each test result within the fail memory in accordance with the arranged address signals.

* * * * *